United States Patent
Cheng

(10) Patent No.: US 11,238,916 B2
(45) Date of Patent: Feb. 1, 2022

(54) METHOD FOR REFRESHING A MEMORY DEVICE, IN WHICH THE VICTIM ROW REFRESH OPERATION IS HIDDEN IN THE NORMAL REFRESH OPERATION WITHOUT AFFECTING THE TIME ALLOCATED FOR THE NORMAL REFRESH OPERATION

(71) Applicant: Winbond Electronics Corp., Taichung (TW)

(72) Inventor: Kan-Yuan Cheng, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/731,081

(22) Filed: Dec. 31, 2019

(65) Prior Publication Data

US 2021/0201985 A1 Jul. 1, 2021

(51) Int. Cl.
*G11C 11/406* (2006.01)
*G11C 11/4091* (2006.01)

(52) U.S. Cl.
CPC .... *G11C 11/40618* (2013.01); *G11C 11/4091* (2013.01); *G11C 11/40611* (2013.01); *G11C 11/40622* (2013.01)

(58) Field of Classification Search
CPC ........ G11C 11/40618; G11C 11/40622; G11C 11/4091; G11C 11/40611
See application file for complete search history.

(56) References Cited

U.S. PATENT DOCUMENTS

| | | | |
|---|---|---|---|
| 9,117,542 B2 | 8/2015 | Bains | |
| 9,117,544 B2 * | 8/2015 | Bains | G11C 11/40611 |
| 9,286,964 B2 | 3/2016 | Halbert et al. | |
| 9,564,201 B2 * | 2/2017 | Halbert | G06F 3/0616 |
| 9,892,779 B2 | 2/2018 | Kang et al. | |
| 10,170,174 B1 * | 1/2019 | Ito | G11C 11/4087 |
| 10,504,577 B1 * | 12/2019 | Alzheimer | G06F 3/0673 |
| 10,790,005 B1 * | 9/2020 | He | G11C 7/24 |
| 2010/0080075 A1 * | 4/2010 | Kunce | G11C 11/40618 365/222 |
| 2014/0059287 A1 * | 2/2014 | Bains | G11C 7/02 711/106 |
| 2018/0061476 A1 * | 3/2018 | Kim | G11C 11/40611 |
| 2019/0130963 A1 * | 5/2019 | Lee | G11C 11/40618 |
| 2019/0333573 A1 * | 10/2019 | Shin | G11C 11/408 |
| 2019/0348107 A1 * | 11/2019 | Shin | G11C 8/12 |

FOREIGN PATENT DOCUMENTS

| | | |
|---|---|---|
| CN | 108319556 | 7/2018 |
| TW | I543191 | 7/2016 |

* cited by examiner

*Primary Examiner* — Mushfique Siddique
(74) *Attorney, Agent, or Firm* — JCIPRNET

(57) ABSTRACT

A memory device including a memory unit and a control circuit is provided. The memory unit includes a plurality of memory banks. The memory banks are at least divided into a first group and a second group. The control circuit is coupled to the memory unit. The control circuit is configured to perform a first refresh operation on the first group and the second group. When the control circuit performs the first refresh operation on one of the first group and the second group, the control circuit performs a second refresh operation on a victim row of the other one of the first group and the second group. In addition, a method for refreshing a memory device is also provided.

12 Claims, 7 Drawing Sheets

METHOD FOR REFRESHING A MEMORY DEVICE, IN WHICH THE VICTIM ROW REFRESH OPERATION IS HIDDEN IN THE NORMAL REFRESH OPERATION WITHOUT AFFECTING THE TIME ALLOCATED FOR THE NORMAL REFRESH OPERATION

BACKGROUND

Technical Field

The invention relates to an electrical device and a method for operating an electrical device, and more particularly, relates to a memory device and a method for refreshing a memory device.

Description of Related Art

Row hammer is an unintended and undesirable side effect in dynamic random access memory (DRAM) in which memory cells leak their charge due to interaction with their neighboring cells when neighboring rows are accessed. The rows of cells that are unintentionally discharged are called victim rows. A common prevention of row hammer effect is to refresh victim rows more frequently. A common implementation is to have a row hammer circuit that identify victim rows, and refresh the victim rows more often. However, in DDR3/DDR4 standard, there is no explicit external command for victim row refresh. The victim row refresh needs to be somehow hidden and is transparent to users.

SUMMARY

The invention is directed to a memory device and a method for refreshing a memory device, in which the victim row refresh operation is hidden in the normal refresh operation without affecting the time allocated for the normal refresh operation.

The invention provides a memory device including a memory unit and a control circuit. The memory unit includes a plurality of memory banks. The memory banks are at least divided into a first group and a second group. The control circuit is coupled to the memory unit. The control circuit is configured to perform a first refresh operation on the first group and the second group. When the control circuit performs the first refresh operation on one of the first group and the second group, the control circuit performs a second refresh operation on a victim row of the other one of the first group and the second group.

The invention also provides a method for refreshing a memory device including a plurality of memory banks. The method includes dividing the memory banks at least into a first group and a second group; performing a first refresh operation on one of the first group and the second group; and simultaneously performing a second refresh operation on a victim row of the other one of the first group and the second group.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
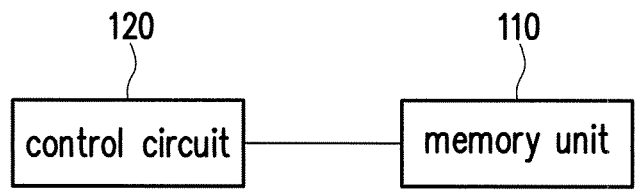
FIG. 1 illustrates a block diagram of a memory device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments are provided below to describe the invention in detail, though the disclosure is not limited to the provided embodiments, and the provided embodiments can be suitably combined. The term "coupling/coupled" used in this specification (including claims) of the application may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

Figure 2:
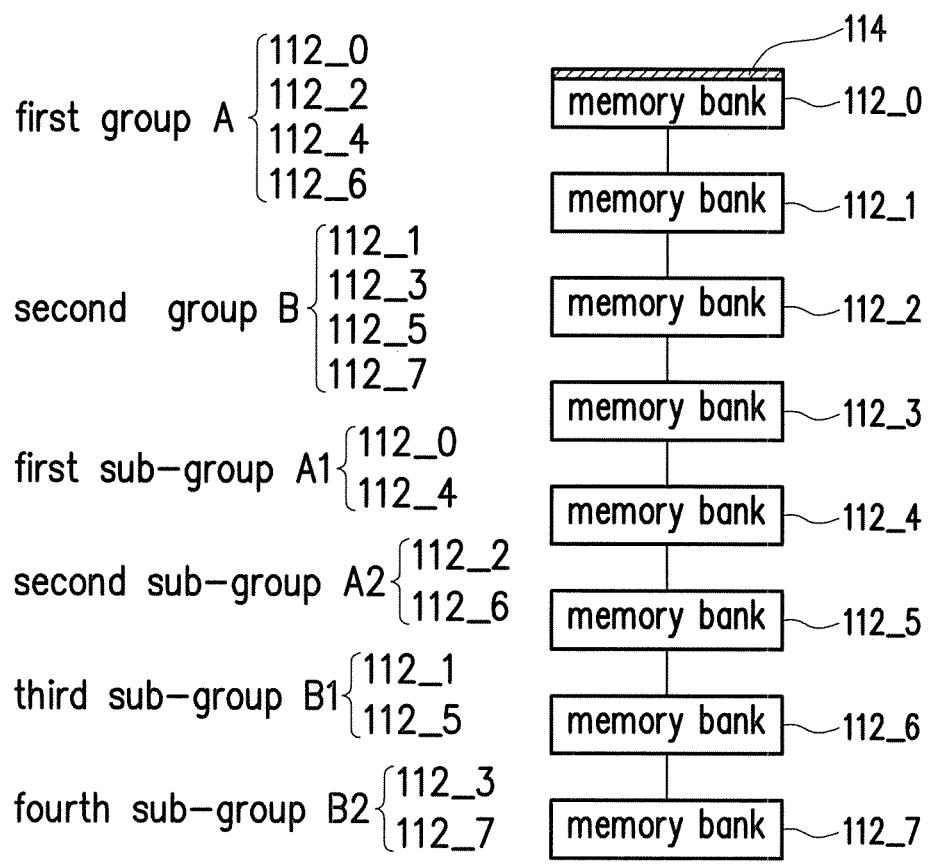
FIG. 2 illustrates a block diagram of a memory unit depicted in FIG. 1.

FIG. 1 illustrates a block diagram of a memory device according to an embodiment of the invention. FIG. 2 illustrates a block diagram of a memory unit depicted in FIG. 1. Referring to FIG. 1 and FIG. 2, the memory device 100 of the present embodiment includes a memory unit 110 and a control circuit 120. The memory unit 110 includes a plurality of memory banks 112_0 to 112_7. In the present embodiment, eight memory banks are illustrated in FIG. 2 for example, but the number of the memory banks does not intend to limit the invention.

The memory unit 110 is coupled to the control circuit 120. The control circuit 120 is configured to perform a first refresh operation and a second refresh operation on the memory unit 110. In an embodiment, the control circuit 120 may be a memory controller, for example. The memory controller may be implemented by Central Processing Unit (CPU), Microprocessor, Digital Signal Processor (DSP), Programmable Controller, Programmable Logic Device (PLD), or other similar devices, or a combination of the said devices, which are not particularly limited by the invention.

In the present embodiment, the first refresh operation may be a normal refresh operation performed on a memory bank, and the second refresh operation may be a victim row refresh operation performed on at least one victim row of a memory bank. The amount of rows refreshed in the first refresh operation is more than the amount of rows refreshed in the second refresh operation. In FIG. 2, a victim row 114 is illustrated in the memory bank 112_0, but the invention is not limited thereto. Row hammer is an unintended and undesirable side effect in DRAM in which memory cells leak their charge due to interaction with their neighboring cells when neighboring rows are accessed. The rows of cells that are unintentionally discharged are called victim rows. In the present embodiment, the victim row refresh operation (i.e. the second refresh operation) is hidden without affecting either the frequency of the normal refresh operation (i.e. the first refresh operation), or the time allocated to the normal refresh operation for each refresh command.

Figure 3:
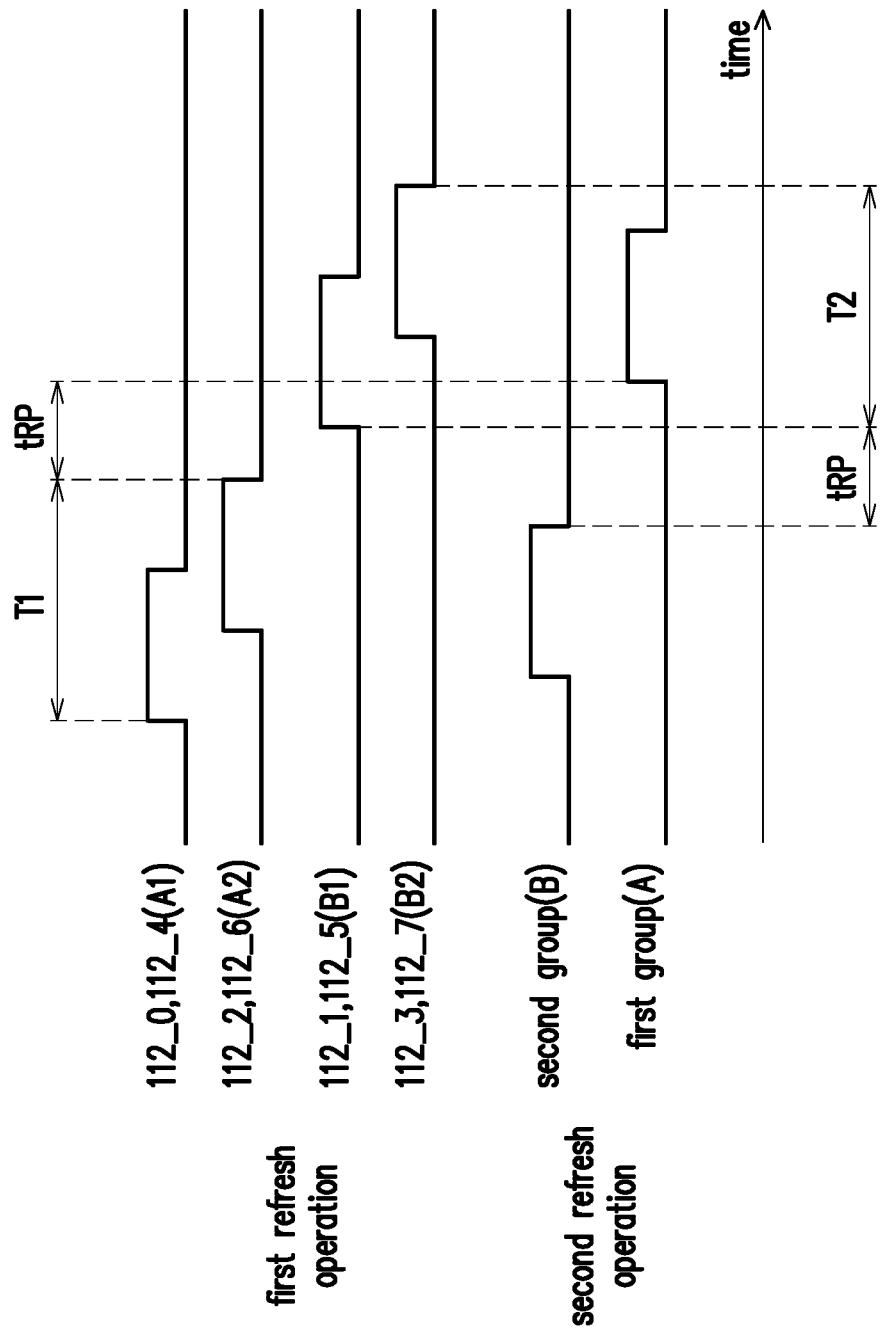
FIG. 3 illustrates a waveform diagram of signals that indicates the first refresh operation and the second refresh operation are performed on the memory banks according to an embodiment of the invention.

To be specific, FIG. 3 illustrates a waveform diagram of signals that indicates the first refresh operation and the second refresh operation are performed on the memory banks according to an embodiment of the invention. Referring to FIG. 2 and FIG. 3, for the first refresh operation, the memory banks 112_0 to 112_7 are at least divided into a first group A and a second group B. For example, the first group A includes even banks 112_0, 112_2, 112_4 and 112_6, and the second group B includes odd banks 112_1, 112_3, 112_5 and 112_7. The first group A is further divided into a first sub-group A1 and a second sub-group A2. The first sub-group A1 includes the memory banks 112_0 and 112_4, and the second sub-group A2 includes the memory banks 112_2 and 112_6. The second group B is divided into a third sub-group B1 and a fourth sub-group B2. The third sub-group B1 includes the memory banks 112_1 and 112_5, and the fourth sub-group B2 includes the memory banks 112_3 and 112_7. The number of the groups, the number of the sub-groups, and the elements included in each of the groups and the sub-groups are described for example and do not intend to limit the invention.

In the present embodiment, the memory banks 112_0 to 112_7 in each group are further divided into two sub-groups for the first refresh operation, with the memory banks 112_0 to 112_7 in each sub-group staggered in time for the first refresh operation. A rising edge for a bank represents the time that the bank is activated for refresh. A falling edge for a bank represents the time that the bank is precharged, or the end time of refresh operation for the bank. The control circuit 120 sequentially performs the first refresh operation on the first sub-group A1, the second sub-group A2, the third sub-group B1 and the fourth sub-group B2 in the present embodiment.

When the control circuit 120 performs the first refresh operation on the first group A during a period T1, the control circuit 120 performs the second refresh operation on a victim row of the second group B during the same period T1. Next, when the control circuit 120 performs the first refresh operation on the second group B during a period T2, the control circuit 120 performs the second refresh operation on a victim row of the first group A during the same period T2. In FIG. 2, the victim row 114 is illustrated in the memory bank 112_0, i.e. the first group A, but the invention is not limited thereto. That is to say, when the control circuit 120 performs the first refresh operation on one of the first group A and the second group B, the control circuit 120 performs the second refresh operation on the victim row of the other one of the first group A and the second group B.

In addition, after the control circuit 120 performs the first refresh operation on the first group A, the control circuit 120 performs the second refresh operation on the victim row of the first group A after a row precharge time tRP. The row precharge time tRP is a time that a bank is available for subsequent row activation or refresh after the bank is precharged. On the other hand, after the control circuit 120 performs the second refresh operation on the victim row of the second group B, the control circuit 120 performs the first refresh operation on the second group B after the row precharge time tRP. That is to say, in order to satisfy the row precharge time tRP requirement, the first refresh operation for the second group B, or the second refresh operation for the first group A may need to be postponed.

Figure 4:
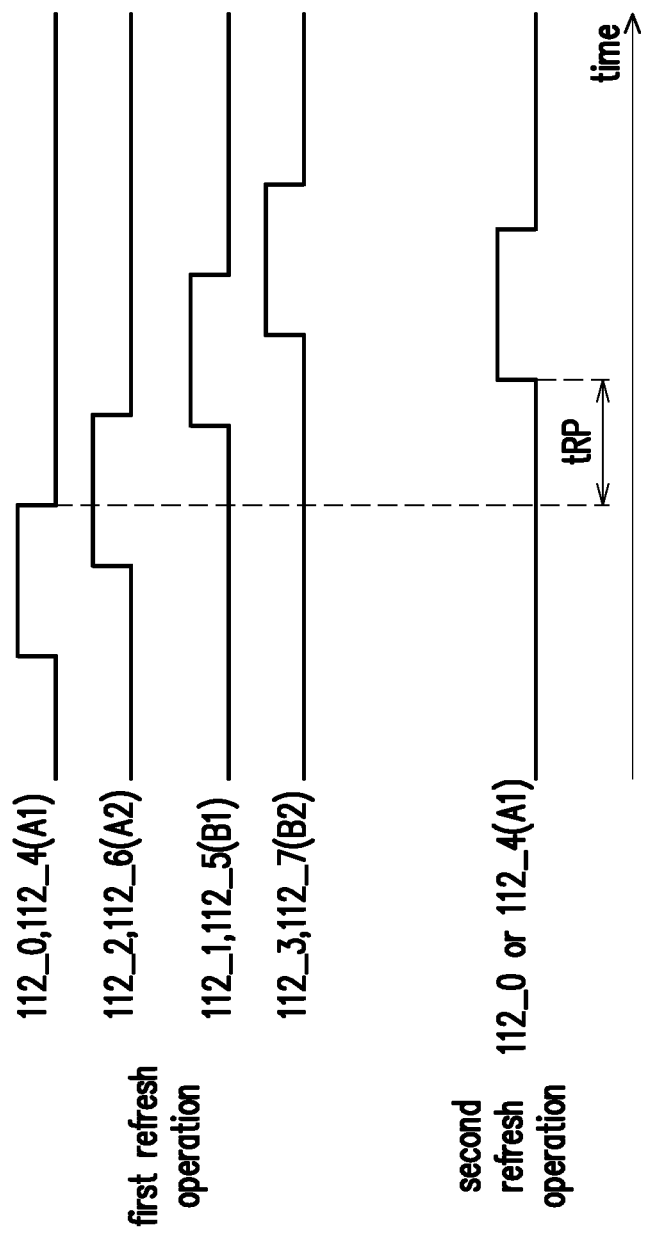
FIG. 4 illustrates a waveform diagram of signals that indicates the first refresh operation and the second refresh operation are performed on the memory banks according to another embodiment of the invention.

FIG. 4 illustrates a waveform diagram of signals that indicates the first refresh operation and the second refresh operation are performed on the memory banks according to another embodiment of the invention. Referring to FIG. 2 and FIG. 4, the control circuit 120 sequentially performs the first refresh operation on the first sub-group A1, the second sub-group A2, the third sub-group B1 and the fourth sub-group B2 in the present embodiment. The victim row is located in the memory bank 112_0 or 112_4 (i.e. the first sub-group A1). After the control circuit 120 performs the first refresh operation on the first sub-group A1, the control circuit 120 performs the second refresh operation on a victim row of the first sub-group A1, e.g. the memory bank 112_0 or 112_4, after the row precharge time tRP. In FIG. 2, the victim row 114 is illustrated in the memory bank 112_0, but the invention is not limited thereto.

Figure 5:
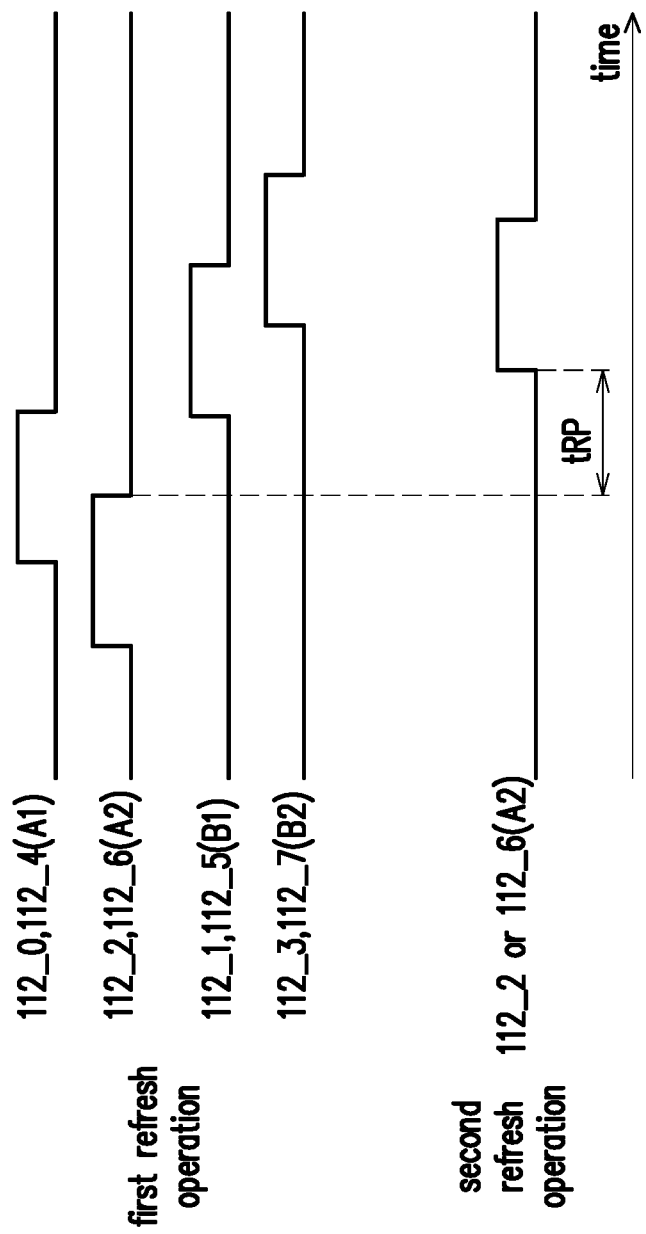
FIG. 5 illustrates a waveform diagram of signals that indicates the first refresh operation and the second refresh operation are performed on the memory banks according to another embodiment of the invention.

In another embodiment, the sequence of the first refresh operation for the first sub-group A1 and the second sub-group A2 may be changed. FIG. 5 illustrates a waveform diagram of signals that indicates the first refresh operation and the second refresh operation are performed on the memory banks according to another embodiment of the invention. Referring to FIG. 2 and FIG. 5, the control circuit 120 sequentially performs the first refresh operation on the second sub-group A2, the first sub-group A1, the third sub-group B1 and the fourth sub-group B2. The sequence of the first refresh operation for the first sub-group A1 and the second sub-group A2 is changed since the victim row is located in the memory bank 112_2 or 112_6 (i.e. the second sub-group A2). After the control circuit 120 performs the first refresh operation on the second sub-group A2, the control circuit 120 performs the second refresh operation on a victim row of the second sub-group A2 after the row precharge time tRP.

Figure 6:
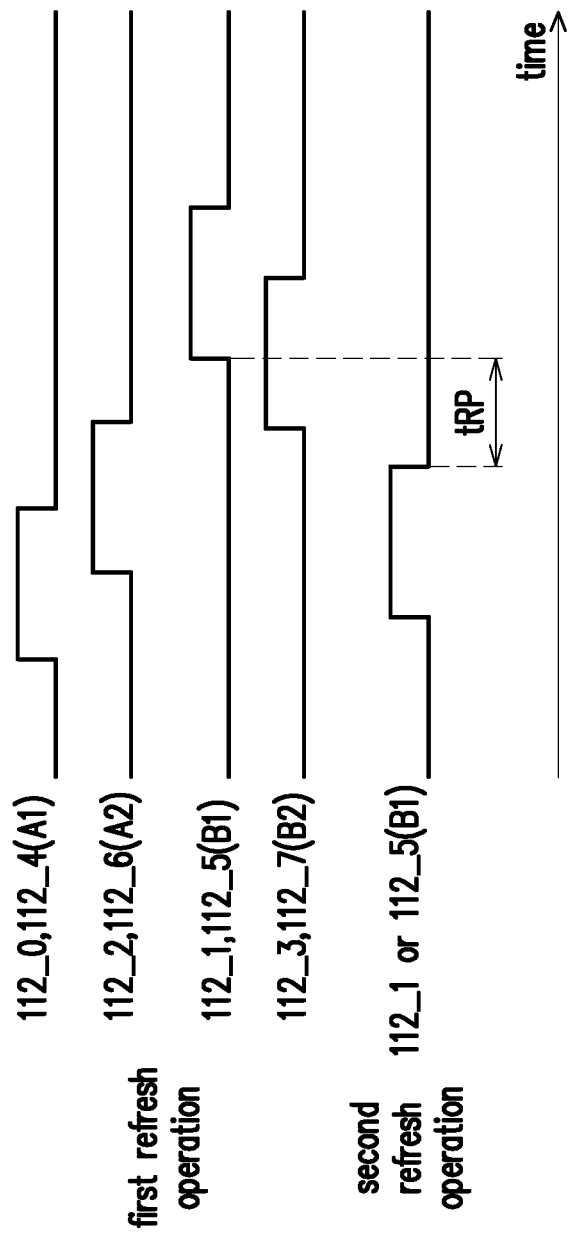
FIG. 6 illustrates a waveform diagram of signals that indicates the first refresh operation and the second refresh operation are performed on the memory banks according to another embodiment of the invention.

FIG. 6 illustrates a waveform diagram of signals that indicates the first refresh operation and the second refresh operation are performed on the memory banks according to another embodiment of the invention. Referring to FIG. 2 and FIG. 6, the control circuit 120 sequentially performs the first refresh operation on the first sub-group A1, the second sub-group A2, the fourth sub-group B2 and the third sub-group B1. The sequence of the first refresh operation for the third sub-group B1 and the fourth sub-group B2 is changed since the victim row is located in the memory bank 112_1 or 112_5 (i.e. the third sub-group B1). The control circuit 120 performs the second refresh operation on the victim row of the third sub-group B1 during the period while the control circuit 120 performs the first refresh operation on the first group A. After the control circuit 120 performs the second refresh operation on the victim row of the third sub-group B1, the control circuit 120 performs the first refresh operation on the third sub-group B1 after the row precharge time tRP.

Figure 7:
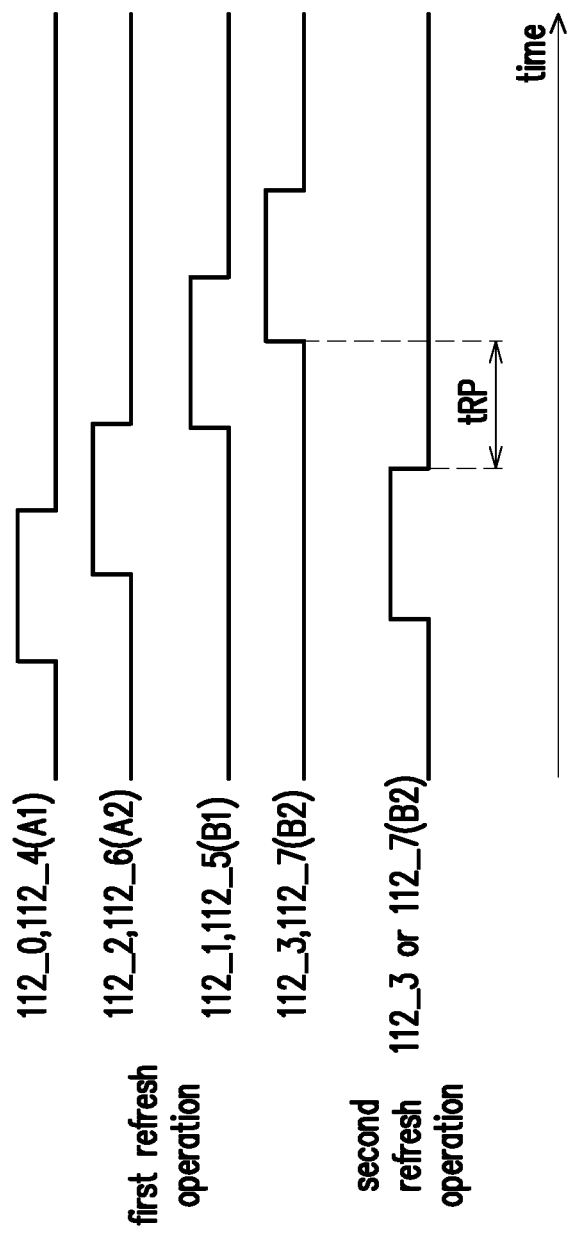
FIG. 7 illustrates a waveform diagram of signals that indicates the first refresh operation and the second refresh operation are performed on the memory banks according to another embodiment of the invention.

FIG. 7 illustrates a waveform diagram of signals that indicates the first refresh operation and the second refresh operation are performed on the memory banks according to another embodiment of the invention. Referring to FIG. 2 and FIG. 7, the control circuit 120 sequentially performs the first refresh operation on the first sub-group A1, the second sub-group A2, the third sub-group B1 and the fourth sub-group B2. The victim row is located in the memory bank 112_3 or 112_7 (i.e. the fourth sub-group B2). The control circuit 120 performs the second refresh operation on the victim row of the fourth sub-group B2 during the period while the control circuit 120 performs the first refresh operation on the first group A. After the control circuit 120 performs the second refresh operation on the victim row of the fourth sub-group B2, the control circuit 120 performs the first refresh operation on the fourth sub-group B2 after the row precharge time tRP.

Figure 8:
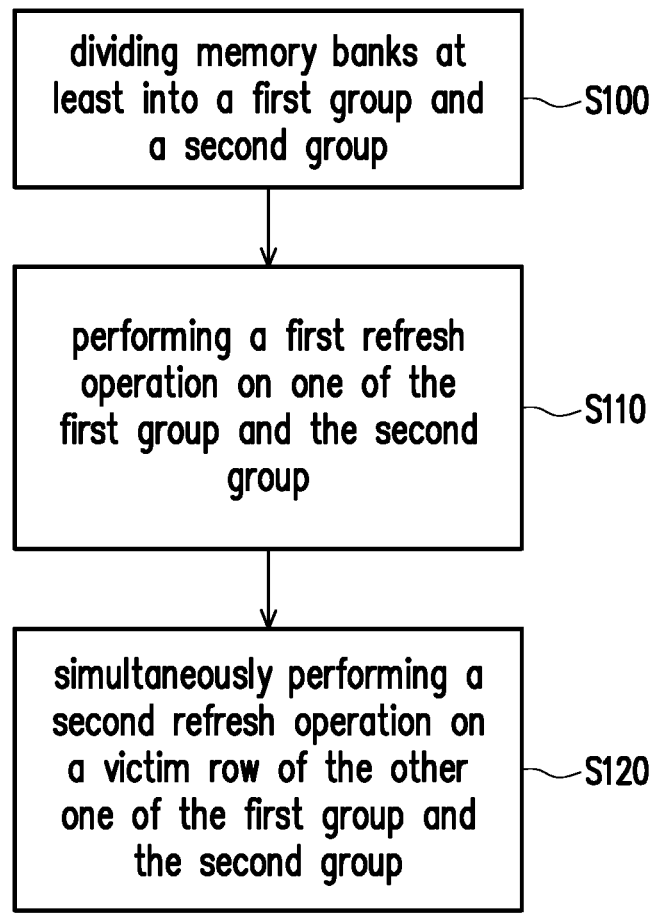
FIG. 8 is a flowchart illustrating steps in a method for refreshing a memory device according to an embodiment of the invention.

FIG. 8 is a flowchart illustrating steps in a method for refreshing a memory device according to an embodiment of the invention. Referring to FIG. 1, FIG. 2 and FIG. 8, the method for refreshing the memory device of the present embodiment is at least adapted to the memory device 100 of FIG. 1 and FIG. 2, but the invention is not limited thereto. Taking the memory device 100 of FIG. 1 and FIG. 2 for example, in step S100, the control circuit 120 divides the memory banks at least into a first group and a second group. In step S110, the control circuit 120 performs the first refresh operation on one of the first group A and the second group B. In the present embodiment, the control circuit 120 performs the first refresh operation in response to an auto-refresh command. In step S120, the control circuit 120 simultaneously performs a second refresh operation on a victim row of the other one of the first group A and the second group B. In addition, sufficient teaching, suggestion, and implementation illustration regarding the method for refreshing the memory device of the embodiments of the invention may be obtained from the foregoing embodiments of FIG. 1 to FIG. 7, and thus related description thereof is not repeated hereinafter.

In summary, in the embodiments of the invention, for the first refresh operation, the banks are divided into two groups. If the victim row is located in banks in the first group, the second refresh operation is performed when the first refresh operation is performed on the second group. If the victim row is located in banks in the second group, the second refresh operation is performed when the first refresh operation is performed on the first group. Therefore, the second refresh operation is hidden without affecting either the frequency of the first refresh operation, or the time allocated to normal refresh for each refresh command.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for refreshing a memory device, wherein the memory device comprises a plurality of memory banks, the method comprising:

dividing the memory banks at least into a first group and a second group; and performing a normal refresh operation on the first group and the second group sequentially;

wherein during a period where the normal refresh operation is performed on one of the first group and the second group, a victim row refresh operation is performed on a victim row of the other one of the first group and the second group, wherein a time allocated to the victim row refresh operation performed on the victim row of the other one of the first group and the second group is shorter than a time allocated to the normal refresh operation performed on the one of the first group and the second group, wherein the victim row refresh operation is hidden without affecting either the frequency of the normal refresh operation and the time allocated to the normal refresh operation for each refresh command.

2. The method of claim 1, wherein after the normal refresh operation is performed on the one of the first group and the second group in response to an auto-refresh command, performing the victim row refresh operation on the victim row of the other one of the first group and the second group after a row precharge time.

3. The method of claim 2, wherein dividing the memory banks at least into the first group and the second group further includes dividing the second group at least into a third sub-group and a fourth sub-group, and wherein after the victim row refresh operation is performed on the victim row of one of the third sub-group and the fourth sub-group, performing the normal refresh operation on the one of the third sub-group and the fourth sub-group after the row precharge time.

4. The method of claim 3, wherein the normal refresh operation is sequentially performed on the third sub-group and the fourth sub-group.

5. The method of claim 3, wherein the normal refresh operation is sequentially performed on the fourth sub-group and the third sub-group.

6. The method of claim 2, wherein dividing the memory banks at least into the first group and the second group further includes dividing the first group at least into a first sub-group and a second sub-group, and wherein after the normal refresh operation is performed on one of the first sub-group and the second sub-group, performing the victim row refresh operation on the victim row of any one of the first sub-group and the second sub-group after the row precharge time.

7. The method of claim 6, wherein the normal refresh operation is sequentially performed on the first sub-group and the second sub-group.

8. The method of claim 6, wherein the normal refresh operation is sequentially performed on the second sub-group and the first sub-group.

9. The method of claim 1, further comprising: performing the victim row refresh operation on the victim row of the second group when the normal refresh operation is performed on the first group in response to an auto-refresh command.

10. The method of claim 9, further comprising: after performing the normal refresh operation on the first group, performing the victim row refresh operation on the victim row of the first group after a row precharge time.

11. The method of claim 1, further comprising: performing the victim row refresh operation on the victim row of the first group when the normal refresh operation is performed on the second group in response to an auto-refresh command.

12. The method of claim 11, further comprising: after performing the victim row refresh operation on the victim row of the second group, performing the normal refresh operation on the second group after a row precharge time.

\* \* \* \* \*